(12) United States Patent
Wang et al.

(10) Patent No.: US 11,652,052 B2
(45) Date of Patent: *May 16, 2023

(54) CONTACT STRUCTURE AND ELECTRONIC DEVICE HAVING THE SAME

(71) Applicant: TPK Advanced Solutions Inc., Fujian (CN)

(72) Inventors: Xi-Zhao Wang, Dengzhou (CN); Yi-Min Jiang, Xiamen (CN); Li-Wei Mu, Guyuan (CN); Shan-Yu Wu, New Taipei (TW); Chao-Hui Kuo, Taipei (TW); Can-Liang Zhao, Pingdingshan (CN); Hong-Yan Lian, Xiamen (CN); Chun-Wei Liu, Miaoli County (TW)

(73) Assignee: TPK Advanced Solutions Inc., Fujian (CN)

( * ) Notice: Subject to any disclaimer, the term of this patent is extended or adjusted under 35 U.S.C. 154(b) by 25 days.

This patent is subject to a terminal disclaimer.

(21) Appl. No.: 17/215,450

(22) Filed: Mar. 29, 2021

(65) Prior Publication Data

US 2022/0308727 A1 Sep. 29, 2022

(51) Int. Cl.
*H01L 23/532* (2006.01)
*G06F 3/041* (2006.01)
*G06F 3/044* (2006.01)
*H01L 31/18* (2006.01)

(52) U.S. Cl.
CPC ...... *H01L 23/53238* (2013.01); *G06F 3/0412* (2013.01); *G06F 3/0443* (2019.05); *G06F 3/0445* (2019.05); *G06F 3/0446* (2019.05); *G06F 3/04164* (2019.05); *H01L 23/53252* (2013.01); *G06F 2203/04103* (2013.01); *H01L 31/1888* (2013.01)

(58) Field of Classification Search
CPC ............... G06F 3/04164; G06F 3/0412; H01L 23/53238; H01L 23/53252
See application file for complete search history.

(56) References Cited

U.S. PATENT DOCUMENTS

| | | | |
|---|---|---|---|
| 11,360,622 B2 * | 6/2022 | Hsiao | G06F 3/0445 |
| 2014/0287639 A1 * | 9/2014 | Lee | H01B 1/22 |
| | | | 442/376 |

FOREIGN PATENT DOCUMENTS

| | | | | |
|---|---|---|---|---|
| CN | 106104706 A | * | 11/2016 | ............... H01B 1/22 |
| TW | 200633800 A | | 10/2006 | |
| TW | 201309777 A | | 3/2013 | |
| TW | 201513132 A | | 4/2015 | |
| TW | 201638972 A | | 11/2016 | |
| TW | 201838820 A | | 11/2018 | |
| TW | 201915685 A | | 4/2019 | |

(Continued)

OTHER PUBLICATIONS

English text machine translation of Hwang et al. (CN 106104706 A) Description and Claims, accessed online from Espacenet; see attached PDF pp. 1-35. (Year: 2016).*

*Primary Examiner* — Katie L. Hammer
(74) *Attorney, Agent, or Firm* — Cooper Legal Group, LLC (57) ABSTRACT

The present disclosure provides a contact structure and an electronic device having the same. The contact structure includes a substrate, a copper layer, an organic composite protective layer, and a silver nanowire layer. The copper layer is disposed on the substrate. The nanowire-distribution-promotion layer is disposed between the copper layer and the silver nanowire layer.

20 Claims, 7 Drawing Sheets

(56) References Cited

FOREIGN PATENT DOCUMENTS

| | | | |
|---|---|---|---|
| TW | 202035152 | A | 10/2020 |
| TW | 202035788 | A | 10/2020 |
| WO | 2013069919 | A1 | 5/2013 |

* cited by examiner

CONTACT STRUCTURE AND ELECTRONIC DEVICE HAVING THE SAME

BACKGROUND

1. Field of the Disclosure

The present disclosure relates to a contact structure and an electronic device having the same, and more particularly, to a contact structure with stacked copper layer and silver nanowire layer, and an electronic device having the same.

2. Related Art

In the related art, in some electronic devices (such as touch panels), in the contact area where the touch electrode and the transmission line meet, a copper material layer is mostly used as the material of the transmission line, and a silver nanowire layer is used as the touch electrode. However, there are problems of aggregation and poor distribution for silver nanowire at the above-mentioned contact surface, thereby causing incomplete etching in the etching process for this contact area. Due to the incomplete etching of lines, the intervals between the lines cannot be reduced, and the requirement for narrow bezel products cannot be met.

Figure 1A:
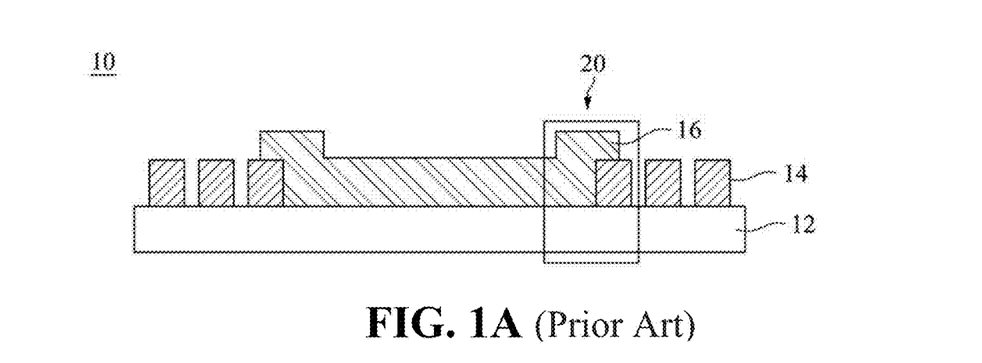
FIG. 1A shows a schematic diagram of an electronic device including a contact structure in the related art before being treated with a stripping solution of the yellow-light process.
Figure 1B:
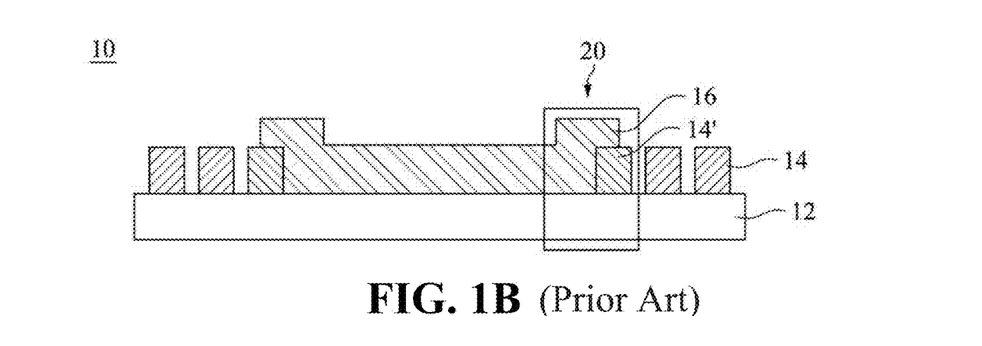
FIG. 1B shows a schematic diagram of the electronic device including the contact structure in the related art after being treated with a stripping solution of the yellow-light process.
Figure 1C:
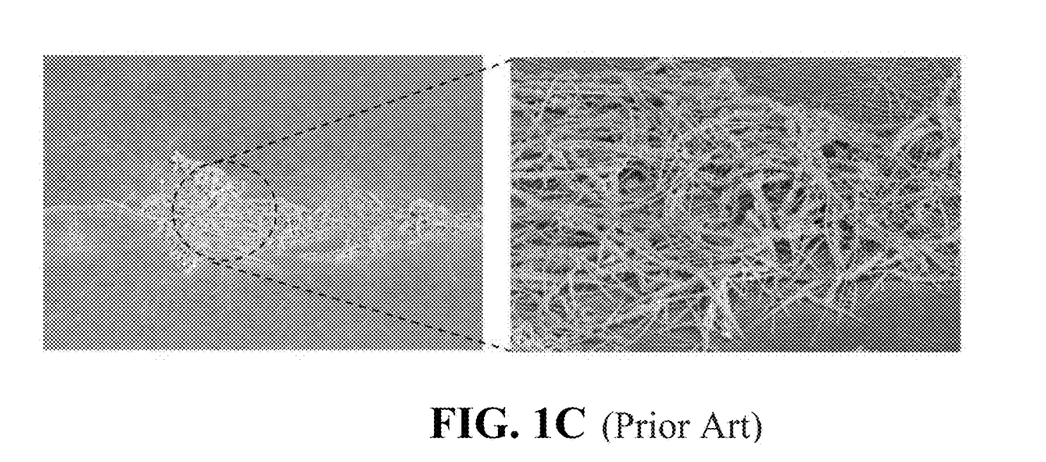
FIG. 1C is a photograph showing the aggregation phenomenon of the silver nanowires in the related art.

FIG. 1A shows a schematic diagram of a device 10 including a contact area 20 in the related art before being treated with a stripping solution of a yellow-light process. The device 10 includes a substrate 12, a copper layer 14 disposed on the substrate 12, and a silver nanowire layer 16 disposed on the substrate 12 and partially covering the copper layer 14. FIG. 1B shows a schematic diagram of the device 10 of FIG. 1A after being treated with a stripping solution of the yellow-light process, wherein a silver nanowire aggregation phenomenon easily occurs between the copper layer 14' and the silver nanowire layer 16 at the contact area 20 (as shown in FIG. 1C).

The silver nanowire aggregation between the copper layer 14' and the silver nanowire layer 16 will affect the line width and line interval of the product. For example, products with a line width<50 nm are prone to etching residues, which cause the condition of electrical abnormalities (such as short circuits). In view of this, the contact structure between the silver nanowire layer 16 and the copper layer 14' in the related art needs to be improved.

SUMMARY OF THE DISCLOSURE

An objective of an embodiment of the present disclosure is to provide a contact structure, wherein by disposing a nanowire-distribution-promotion layer on the copper layer, in the stacked structure of the copper layer and the silver nanowire layer, the uniform distribution degree of silver nanowire on the copper layer is increased, so as to prevent the incomplete etching phenomenon in the subsequent etching process due to the aggregated silver nanowire.

Another objective of an embodiment of the present disclosure is to provide a nanowire-distribution-promotion layer, which allows the uniform distribution of the silver nanowire material layer on the copper layer, so as to manufacture elements/products with a finer line width and line interval (such as line width<10 nm) by the etching process.

Some embodiments of the present disclosure provide a contact structure, including a substrate, a copper layer, a nanowire-distribution-promotion layer, and a silver nanowire layer. The copper layer is disposed on the substrate. The nanowire-distribution-promotion layer is disposed on the copper layer, wherein the nanowire-distribution-promotion layer forms a monomolecular adsorption layer on a surface of the copper layer. The silver nanowire layer is disposed on the nanowire-distribution-promotion layer. Fewer than 5 particles with a diameter of more than 40 μm are present between the copper layer and the silver nanowire layer.

In some embodiments, the nanowire-distribution-promotion layer is an organic layer formed by curing a composite formulated organic coating material, and the composite formulated organic coating material includes 0.05 wt % to 2.5 wt % of a base solution, 1.5 wt % to 10 wt % of an additive and 80 wt % to 99.8 wt % of a solvent.

In some embodiments, the base solution is a first coupling agent, the additive is a second coupling agent, a chelating agent, a polyurethane (PU) based resin or a combination thereof, and the first coupling agent is different from the second coupling agent.

In some embodiments, the first coupling agent is an epoxy-based silane coupling agent, and the second coupling agent is an amine-based silane coupling agent.

In some embodiments, the base solution is an epoxy-based silane coupling agent, the additive is a chelating agent, and a volume ratio of the epoxy-based silane coupling agent to the chelating agent is 3:1.

In some embodiments, the nanowire-distribution-promotion layer has a thickness of about 50 nm to about 100 nm.

In some embodiments, the base solution is an epoxy-based silane coupling agent, the additive is an amine-based silane coupling agent, and a volume ratio of the epoxy-based silane coupling agent to the amine-based silane coupling agent is 1:4.

Some embodiments of the present disclosure provide an electronic device, which includes a contact structure formed by a copper layer and a silver nanowire layer.

In some embodiments, the contact structure of the electronic device is located in a peripheral area of the electronic device.

BRIEF DESCRIPTION OF THE DRAWINGS

The various aspects of the present disclosure will be most easily understood when the following detailed description is read in conjunction with the accompanying drawings. It should be noted that, according to industry standard operating procedures, various feature structures may not be drawn to scale. In fact, for clarity of discussion, the sizes of various feature structures can be increased or decreased arbitrarily.

DETAILED DESCRIPTION

The following disclosure provides different embodiments or examples to achieve different features of the above objectives. Specific examples of components and configurations are described below to simplify the present disclosure. These are, of course, examples only and are not intended to limit the present disclosure. For example, in the following description, the first feature is formed to be higher than the second feature, wherein an embodiment, in which the first and second features are formed to directly contact with each other, can be included; in addition, an embodiment, in which additional features are provided between the first and second features and thus the first and second features are not formed to directly contact with each other, can be included. In addition, in the present disclosure, numbers and/or letters may be repeatedly used as reference numeral in each example. Such repetition does not refer to the relationship between individual embodiments and/or configurations discussed.

Further, in order to facilitate the description of the relationship between one element or feature and another element or feature as shown in the drawings, relative spatial terms, such as "below", "under", "lower", "on", "above", "higher", and the like may be used here. In addition to the directions shown in the drawings, the relative spatial terms are intended to contain different directions of the device in use or in operation. The device can be oriented in other directions (such as being rotated by 90 degrees or other directions), which can also be interpreted correspondingly by the spatial relative terms used here.

Figure 2A:
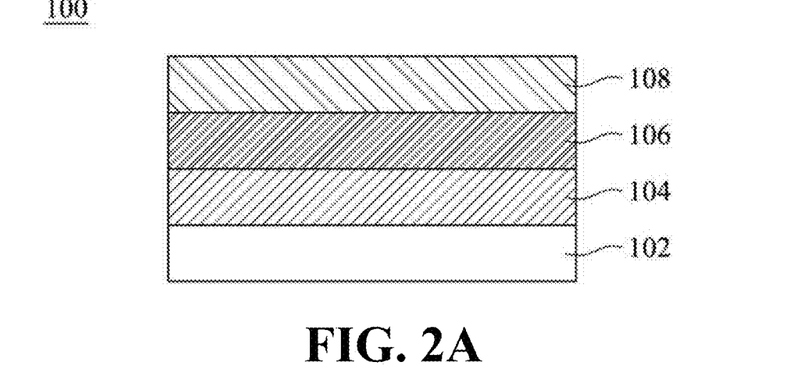
FIG. 2A shows a schematic cross-sectional view of a contact structure according to some embodiments of the present disclosure.

Refer to FIG. 2A, which shows a contact structure 100 according to some embodiments of the present disclosure. The contact structure 100 includes a substrate 102, a copper layer 104, a nanowire-distribution-promotion layer 106, and a silver nanowire layer 108. The copper layer 104 is disposed on the substrate 102. The nanowire-distribution-promotion layer 106 is disposed on the copper layer 104. The silver nanowire layer 108 is disposed on the nanowire-distribution-promotion layer 106. In other words, the nanowire-distribution-promotion layer 106 is disposed between the copper layer 104 and the silver nanowire layer 108, which does not affect the electrical connection between the copper layer 104 and the silver nanowire layer 108 and allows a better distribution ability for the silver nanowire material on the copper layer 104, thereby solving the risk in a subsequent process caused by the non-uniformly distributed silver nanowire. For example, the uniformly distributed silver nanowires can be well etched in the subsequent etching process, thereby achieving excellent etching uniformity, which is especially suitable for the etching process of narrow bezels.

Figure 2B:
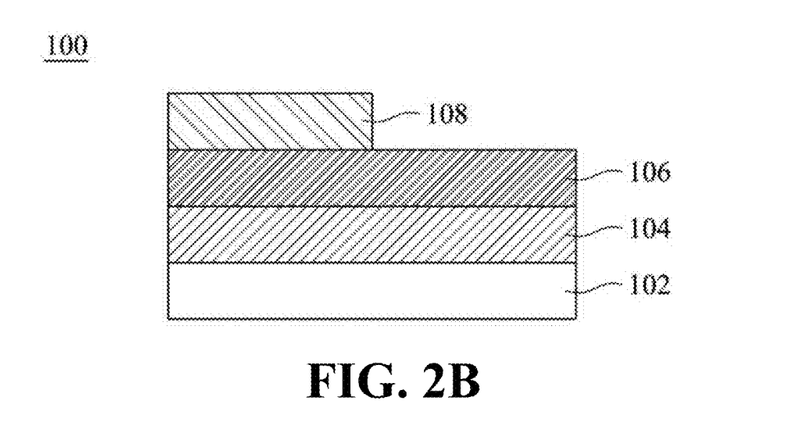
FIG. 2B shows a schematic cross-sectional view of a contact structure according to some embodiments of the present disclosure.

In other embodiments, as shown in FIG. 2B, the silver nanowire layer 108 partially covers the copper layer 104. In other words, a part of the copper layer 104 indirectly contacts the silver nanowire layer 108 via the nanowire-distribution-promotion layer 106, and there is no silver nanowire layer covering a remaining part of the copper layer 104.

In some embodiments of the present disclosure, the nanowire-distribution-promotion layer 106 in the contact structure 100 is an extremely thin organic layer formed by curing a composite formulated organic coating material, and the composite formulated organic coating material includes: component A, i.e., base solution (0.05 wt % to 2.5 wt %); component B, i.e., additive (1.5 wt % to 10 wt %); and component C, i.e., solvent (80 wt % to 99.8 wt %). The base solution is a first coupling agent such as an epoxy-based silane coupling agent, the additive is a second coupling agent, an organic ligand (such as a chelating agent), an organic resin, or a combination thereof. The second coupling agent can be an amine-based silane coupling agent. The solvent can be water or alcohols.

In some embodiments, the nanowire-distribution-promotion layer 106 can form a sub-adsorption layer on the metal surface, so as to achieve the effect of modifying the surface of the metal layer (such as the copper layer 104), thereby improving the distribution effect of the silver nanowires on the above-mentioned surface(s).

In some embodiments, the nanowire-distribution-promotion layer 106 has a thickness of about 50 nm to about 100 nm, such as 50, 60, 70, 80, 90, or 100 nm.

In some embodiments, the contact structure 100 of the present disclosure can be widely used at the location where the copper layer 104 and the silver nanowire layer 108 are stacked and contact with each other. For example, refer to FIG. 3, which shows an element 200 according to other embodiments of the present disclosure. The element 200 includes a contact structure 210. The contact structure 210 includes a substrate 212, a copper layer 214 (wherein the copper layer indirectly contacting with a silver nanowire layer 218 denotes a copper layer 214"), a nanowire-distribution-promotion layer 216, and the silver nanowire layer 218. The contact structure 210 may be the location where the touch electrode and the signal transmission line in the touch panel meet or are overlapped with each other, wherein the silver nanowire layer 218 is used as the touch electrode, the copper layer 214 is used as the signal transmission line, and the contact structure 210 allows the signal of the touch electrode to be transmitted to the signal transmission line. Specifically, the contact structure 210 may be located in the peripheral area of the touch panel or be adjacent to the boundary area between the peripheral area and a visible area. The nanowire-distribution-promotion layer 216 is located between the copper layer 214" and the silver nanowire layer 218, which does not affect the electrical connection between the copper layer 214" and the silver nanowire layer 218. In addition, the nanowire-distribution-promotion layer 216 allows a good distribution of the silver nanowires on the copper layer 214", thereby improving the etching uniformity of the etching solution for the silver nanowires in the manufacturing process. That is, even under a condition of smaller intervals, there will be no silver nanowires remaining between adjacent electrodes (for example, adjacent peripheral leading wires 220), thereby reducing the width of the peripheral area.

Figure 3:
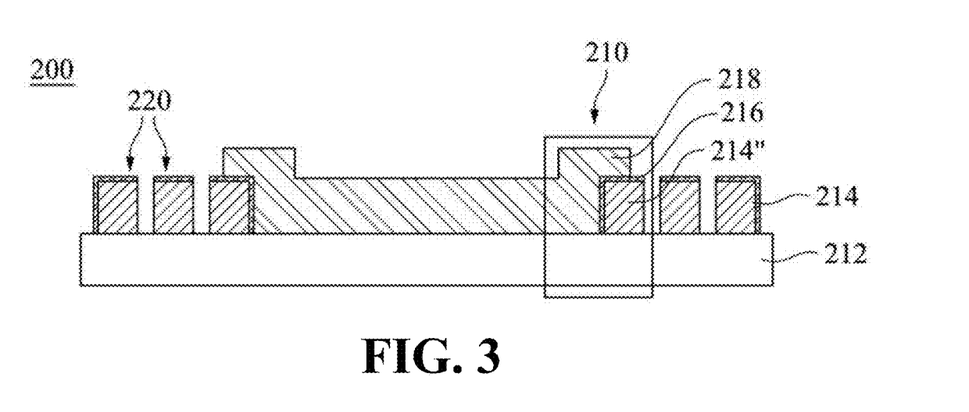
FIG. 3 shows a schematic cross-sectional view of an electronic device according to some embodiments of the present disclosure.

In addition, the upper surface and/or side surfaces of some copper layers 214 may also be covered with the nanowire-distribution-promotion layer 216, as shown in FIG. 3.

Figure 4:
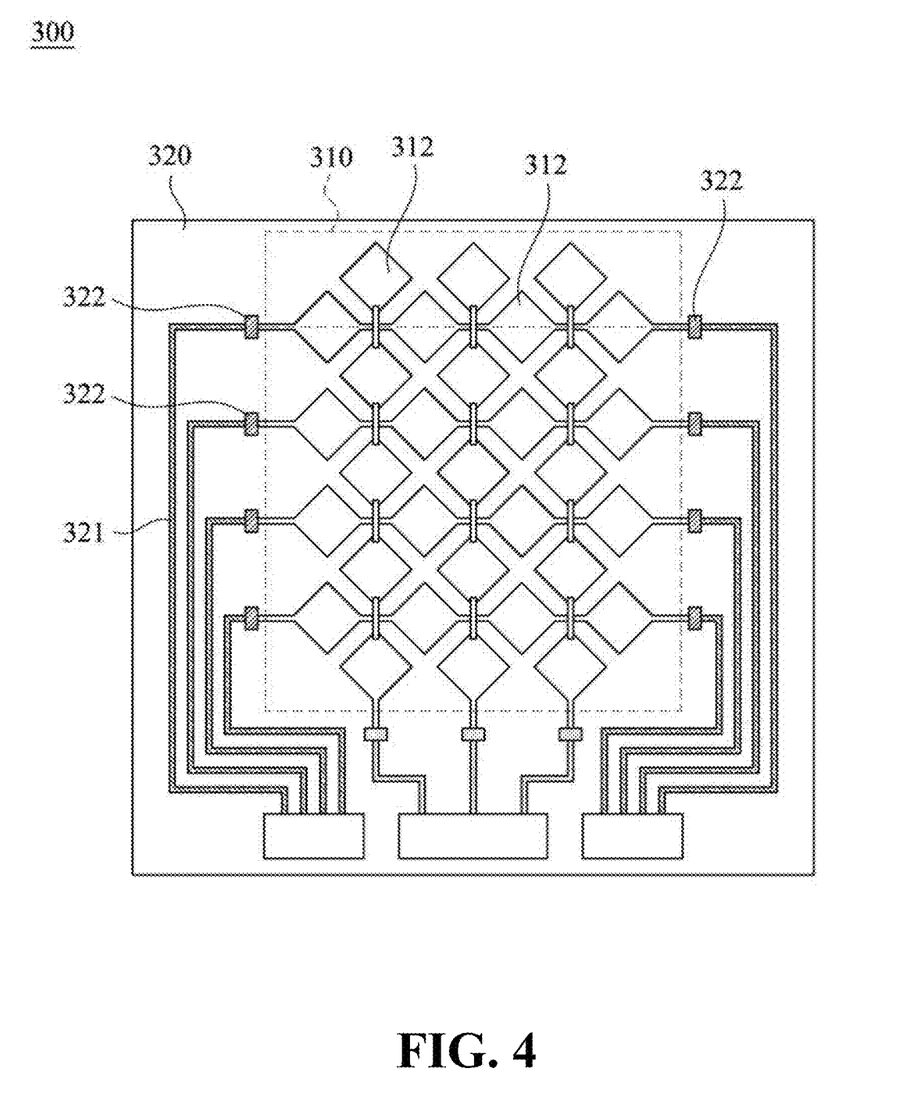
FIG. 4 shows a top view of a touch panel according to some embodiments of the present disclosure.

The contact structure 100/200 provided in the embodiments of the present disclosure can be applied to display devices, for example, electronic devices with panels, such as mobile phones, tablets, wearable electronic devices (such as smart bracelets, smartwatches, virtual reality devices, etc.), televisions (TV), display, notebooks, e-books, digital photo frames, navigators, or the like. The contact structure 100/200 and the touch panel 300 (as shown in FIG. 4) of the embodiments of the present disclosure can be assembled with other electronic elements to form a device/product, such as a display with a touch function. For example, the contact structure 100/200 and the touch panel 300 can be adhered to a display element (not shown), such as a liquid crystal display element or an organic light emitting diode (OLED) display element, and an optical glue or other similar adhesive agents can be used between the contact structure 100/200 and the touch panel 300 for adhesion. Alternatively, the contact structure 100/200 and the touch panel 300 can be adhered to an optical film, such as a polarizing plate (stretching type polarizing plate or liquid crystal coating type polarizer), an optical retardation film, etc. The contact structure 100/200, the touch panel 300, etc. of the embodiments of the present disclosure can be applied to electronic devices such as portable phones, tablet computers, notebook computers, etc. and also can be applied to flexible products. The contact structure 100/200 and touch panel 300 of the embodiments of the present disclosure can also be applied to wearable devices (such as watches, glasses, smart clothes, smart shoes, etc.) and automotive devices (such as dashboards, dashcams, automotive rear view mirrors, automotive windows, etc.).

Refer to FIG. 4, which shows a top view of the touch panel 300 in a display device. The touch panel 300 includes a display area 310 and a peripheral area 320. In the display area 310, a touch sensing electrode 312 is formed of a conductive material including silver nanowire. In the peripheral area 320, a signal transmission line 321 (also referred to as a peripheral leading wire) is formed of copper layer. The peripheral area 320 includes a plurality of lap joint areas 322 where the touch sensing electrode 312 is electrically connected to the signal transmission line 321 for signal transmission. The lap joint areas 322 may include the contact structure 210 as shown in FIG. 3.

In some embodiments, in the lap joint areas 322, the silver nanowire layer covers one side surface and part or entire of the upper surface of the copper layer of the signal transmission line, wherein the nanowire-distribution-promotion layer is located between the copper layer and the silver nanowire layer.

In some embodiments, a copper layer is formed in the peripheral area 320 on the substrate of the touch panel 300, and then a nanowire-distribution-promotion layer is disposed on the copper layer. After that, a silver nanowire layer is formed in the display area 310 and the peripheral area 320 on the substrate, and the silver nanowire layer is also formed on the copper layer and the nanowire-distribution-promotion layer in the peripheral area 320. The patterning process, which includes procedures of coating of a photoresist layer, exposure, development, etching, and the like, is then performed. Therefore, a touch sensing electrode pattern is formed in the display area 310, and a plurality of separated signal transmission lines 321 are formed in the peripheral area 320. In the lap joint areas 322 after being treated with etching, the silver nanowire layer is located on the copper layer, and the nanowire-distribution-promotion layer is located between the copper layer and the silver nanowire layer. In some embodiments, in the peripheral area 320, the silver nanowire layer, the nanowire-distribution-promotion layer, and the copper layer have mutually aligned sides (i.e., a common etched surface). Then, the space between the electrode patterns and the space between the signal transmission lines 321 are filled with an insulating material.

In an alternative embodiment, the silver nanowire layer is not merely formed in the lap joint areas 322, but extends to the entire peripheral area 320, so as to be subjected to one time etching with the copper layer. Alternatively, a process of first etching the silver nanowire layer and the nanowire-distribution-promotion layer, and then etching the copper layer can be performed. Accordingly, the signal transmission line 321 in the peripheral area 320 is a composite structure of silver nanowire layer/nanowire-distribution-promotion layer/copper layer. Particularly, refer to FIGS. 5A to 5C in combination with the description of the following disclosure.

Figure 5A:
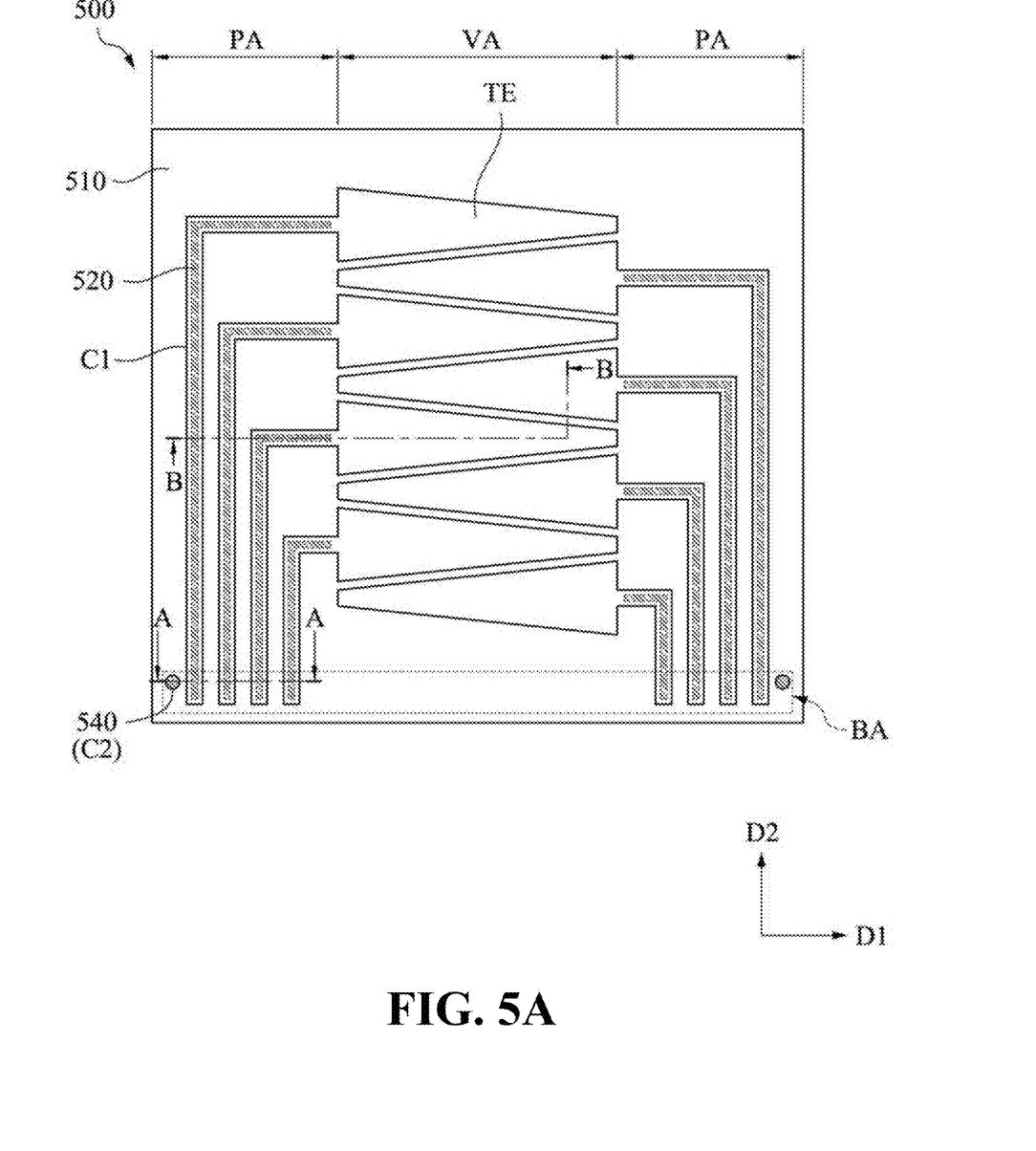
FIG. 5A shows a schematic top view of a touch panel according to some embodiments of the present disclosure.
Figure 5B:
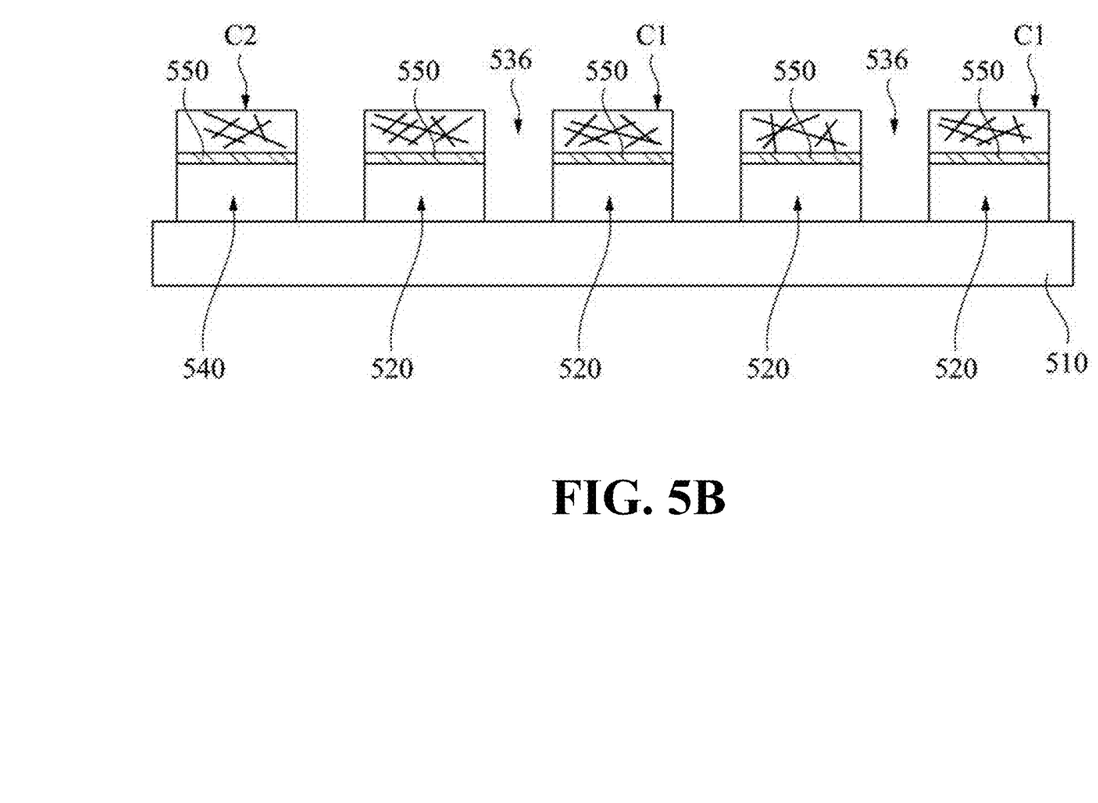
FIG. 5B is a schematic cross-sectional view along line A-A of FIG. 5A.
Figure 5C:
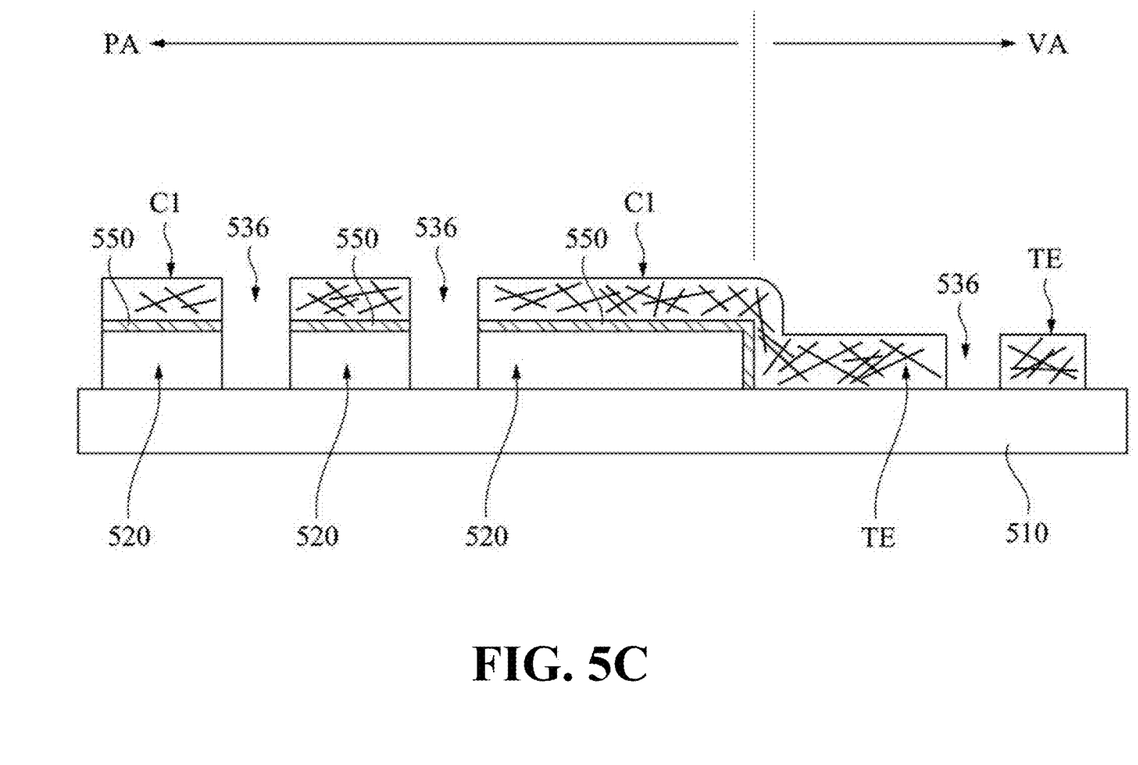
FIG. 5C is a schematic cross-sectional view along line B-B of FIG. 5A.

FIG. 5 shows a schematic top view of a touch panel 500 according to some embodiments of the present disclosure; FIGS. 5B and 5C are cross-sectional views along lines A-A and B-B of FIG. 5A, respectively. A touch panel 500 includes a substrate 510, a peripheral leading wire 520, a marker 540, a first overlay C1, a second overlay C2, a nanowire-distribution-promotion layer 550 (referring to FIGS. 5B and 5C), and a touch sensing electrode TE. The numbers of the peripheral leading wire 520, the marker 540, the first overlay C1, the second overlay C2, and the touch sensing electrode TE mentioned above may be one or more, respectively, and their numbers illustrated in the following specific embodiments and the drawings are for the illustrative purpose only and do not intend to limit the present disclosure.

Referring to FIG. 5A, the substrate 510 has a display area VA and a peripheral area PA. The peripheral area PA is disposed at the side of the display area VA. For example, the peripheral area PA can be a frame-shaped area (that is, containing the right, left, upper and lower sides) disposed around the display area VA. However, in other embodiments, the peripheral area PA can be an L-shaped area disposed at the left and lower sides of the display area VA. In addition, as shown in FIG. 5A, in this present embodiment, the peripheral area PA of the substrate 510 is provided with eight sets of peripheral leading wires 520 and first overlays C1 corresponding to the peripheral leading wires 520 in total, and the touch sensing electrode TE is disposed in the display area VA of the substrate 510. In this embodiment, the peripheral area PA of the substrate 510 is further provided with two sets of markers 540 and second overlays C2 corresponding to the markers 540. A nanowire-distribution-promotion layer 550 is disposed between the first overlay C1 and the peripheral leading wire 520, so as to avoid the aggregation phenomenon of the above-mentioned silver nanowires on the surface of the peripheral leading wire 520. The nanowire-distribution-promotion layer 550 is also disposed between the second overlay C2 and the marker 540; in addition, the first overlay C1 and the second overlay C2 are disposed on the peripheral leading wire 520 and the marker 540, respectively, such that both the upper and lower layers of material are formed in predetermined positions without alignment. Therefore, the requirement for disposing an alignment error area in the manufacturing process can be reduced or omitted, thereby further reducing the width of the peripheral area PA, and thus achieving the narrow bezel requirement for the display.

In this embodiment, the touch sensing electrode TE is disposed in the display area VA, and the touch sensing electrode TE can be electrically connected to the peripheral leading wire 520. Particularly, the touch sensing electrode TE can also be a metal nanowire layer including at least metal nanowires. That is, the metal nanowires form the touch sensing electrode TE in the display area VA and form the first overlay C1 in the peripheral area PA, and the thickness/characteristics of the nanowire-distribution-promotion layer 550 formed as a monomolecular layer does not affect the electrical conduction between the metal layer (e.g., the peripheral leading wire 520 and the marker 540) and the metal nanowire layer (e.g., the touch sensing electrode TE, the first overlay C1, and the second overlay C2). Therefore, an electrical connection can be achieved by the touch sensing electrode TE through the contact between the first overlay C1, the nanowire-distribution-promotion layer 550, and the peripheral leading wire 520, thereby allowing the signal transmission. The metal nanowires also form the second overlay C2 in the peripheral area PA, and the second overlay C2 is disposed on the marker 540. The marker 540 can be widely interpreted as a non-electrical function pattern, but the marker 540 is not limited to this. In some embodiments of the present disclosure, the peripheral leading wire 520 and the marker 540 can be made of a same metal layer (that is, the two are made of the same metal material), and the touch sensing electrode TE, the first overlay C1, and the second overlay C2 can be made of a same metal nanowire layer.

In this embodiment, the marker 540 is disposed in a bonding area BA of the peripheral area PA, and the marker 540 is a marker for docking and alignment. That is, the marker 540 is a marker for aligning a flexible circuit board (not shown) with the touch panel 500 in a step of bonding an external circuit board, such as the flexible circuit board (not shown) to the touch panel 500 (i.e., a bonding step). However, in the present disclosure, the placement position or function of the marker 540 is not limited. For example, the marker 540 can be any check mark, pattern, or sign required for the manufacturing process, which is within the scope protected by the present disclosure. The marker 540 can have any possible shape, such as circle shape, quadrilateral shape, cross shape, L-shape, T-shape, etc., and the shape of the nanowire-distribution-promotion layer 550 is substantially the same as the marker 540.

As shown in FIGS. 5B and 5C, in the peripheral area PA, a non-conductive area 536 is disposed between adjacent peripheral leading wires 520, so as to electrically isolate the adjacent peripheral leading wires 520, thereby avoiding short circuits. In this embodiment, the non-conductive area 536 is a gap for isolating adjacent peripheral leading wires 520. In the patterning step, the above-mentioned gap can be formed by an etching method, so that the sidewall of the peripheral leading wire 520, the sidewall of the nanowire-distribution-promotion layer 550, and the sidewall of the first overlay C1 form a common etched surface and are aligned with each other. That is, the three are formed in a same etching step. Similarly, the sidewall of the marker 540, the sidewall of the nanowire-distribution-promotion layer 550, and the sidewall of the second overlay C2 form a common etched surface and are aligned with each other. Furthermore, the peripheral leading wire 520, the nanowire-distribution-promotion layer 550, and the first overlay C1 are the same or similar in patterns and sizes, for example, the peripheral leading wire 520, the nanowire-distribution-promotion layer 550, and the first overlay C1 are all in long and straight patterns and are the same or similar in widths.

As shown in FIG. 5C, in the display area VA, a non-conductive area 536 is disposed between adjacent touch sensing electrodes TE, so as to electrically isolate the adjacent touch sensing electrodes TE, thereby avoiding short circuits. In this embodiment, the non-conductive area 536 is a gap for isolating adjacent touch sensing electrodes TE. In one embodiment, the gap between the adjacent touch sensing electrodes TE can be formed by the above-mentioned etching method. In this embodiment, the touch sensing electrode TE and the first overlay C1 can be made of a same metal nanowire layer (such as a silver nanowire layer) so that at the boundary of the display area VA and the peripheral area PA, the metal nanowire layer forms an upslope structure, thereby forming said first overlay C1.

In one embodiment, the touch sensing electrode TE adopts a double-layer configuration. In other words, the upper and lower surfaces of the substrate 510 are both provided with touch sensing electrodes TE, so that each of the peripheral leading wire 520, the first overlay C1, and the nanowire-distribution-promotion layer 550 mentioned above is formed on the upper and lower surfaces of the substrate 510.

Figure 6A:
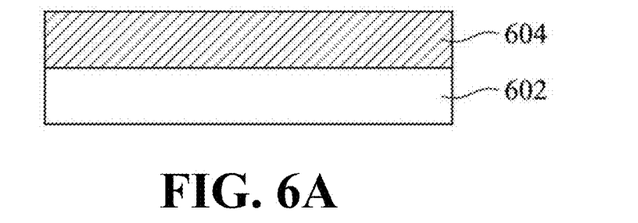
FIGS. 6A to 6C shows schematic cross-sectional views of different steps of a method for manufacturing a contact structure according to the embodiments of the present disclosure.
Figure 6B:
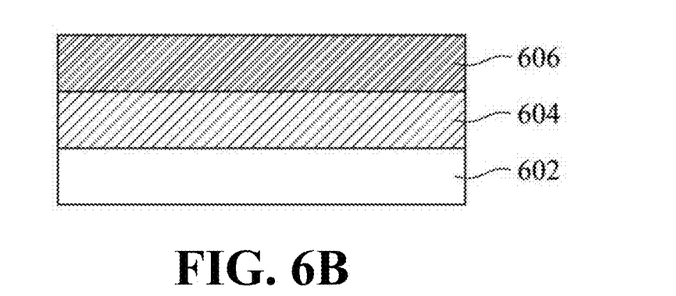
Figure 6C:
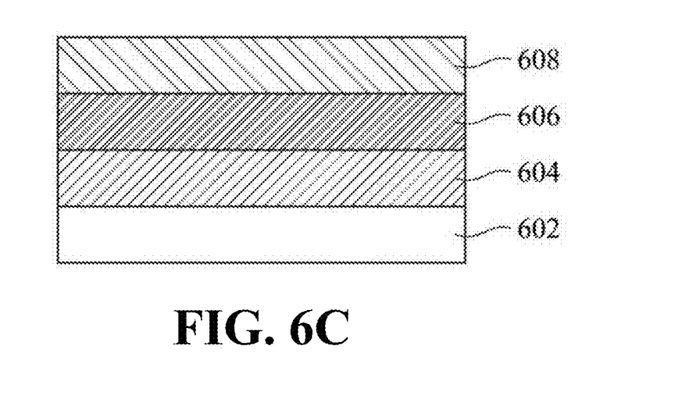

Refer to FIGS. 6A to 6C, which show the flowcharts of manufacturing a contact structure according to some embodiments of the present disclosure.

In FIG. 6A, a copper layer 604 disposed on a substrate 602 is provided.

In some embodiments, the substrate 602 may be a rigid or flexible substrate. The substrate 602 may be transparent or opaque. Suitable rigid substrates include (for example) polycarbonates, acrylics, and the like. Suitable flexible substrates include, but are not limited to polyesters (e.g., polyethylene terephthalate (PET), polynaphthalate ester and polycarbonate), polyolefins (e.g., linear, branched and cyclic polyolefins), polyethylene (for example, polyvinyl chloride, polyvinylidene chloride, polyvinyl alcohol acetal, polystyrene, polyacrylate and the like), cellulose-based polymers (e.g., cellulose triacetate, cellulose acetate), polysulfone (e.g., polyethersulfone), polyimide, polysiloxane, or other polymer films.

The copper layer 604 is disposed on the substrate 602. The copper layer 604 may be disposed on the substrate 602 by electroplating, chemical plating, or other deposition methods.

In FIG. 6B, a nanowire-distribution-promotion layer 606 is disposed on the copper layer 604. In some embodiments, a solution of the composite formulated organic coating material can be coated on the copper layer 604. In other embodiments, the structure including the copper layer 604 may be soaked/dipped in the above-mentioned solution of the composite formulated organic coating material. The composite formulated organic coating material includes a base solution (0.05 wt % to 2.5 wt %), an additive (1.5 wt % to 10 wt %), and a solvent (80 wt % to 99.8 wt %). In some embodiments, in the composite formulated organic coating material, the ratio (volume ratio) of the base solution to the additive is 1:3 to 10:1.

In the above-mentioned coating step, a step of forming a protective layer solution into a nanowire-distribution-promotion layer 606 by curing is further included. In some embodiments, a drying treatment is performed by, for example, air gun blow-drying, and then a pre-baking treatment is performed.

In FIG. 6C, a silver nanowire layer 608 is disposed on the nanowire-distribution-promotion layer 606.

The following are specific examples of the distribution effect of different composite formulated organic coating materials on silver nanowire. The following examples are only illustrated for the composition ratios of the base solution and the additive of the present disclosure, and the ratio/selection of solvents can be adjusted according to the preparation of general chemicals. In the following, the number of silver wires (number of particles) and the size of silver wires (such as diameter) can be calculated and measured with an optical microscope or an electron microscope under the assist of tools such as a computer, but the present disclosure is not limited to this.

In other embodiments, the silane coupling agent composite solution can be an epoxy-based silane coupling agent (general formula: $(R_1-O)_2-Si-R_2-Y$), wherein, $R_1$ is a functional group which can undergo hydrolysis reaction and generate Si—OH, including Cl, OMe (Me is a methyl group), OEt (Et is an ethyl group), $OC_2H_4OCH_3$, OSiMe, etc. $R_2$ is hydrogen atom, methyl group, ethyl group, propyl group, butyl group, phenyl group, cyclohexyl group, vinyl group, propylene group, aminopropyl group, aminoethyl aminopropyl group, mercaptopropyl group, phenylaminomethyl group, etc. Y is a non-hydrolyzable functional group, including: chain olefinic functional groups (mainly vinyl functional group); and alkyl groups with terminal functional groups such as Cl, $NH_2$, SH, $N_3$, epoxy group, (methyl) acryloxy group, isocyanate group, etc., that is, carbon functional groups.

The epoxy-based silane coupling agent may include, for example, hexamethyldisiloxane, tetrakis(trimethylsiloxy)silane, 3-glycidoxypropyltrimethoxysilane, or a combination thereof.

The amine-based silane coupling agent may include but is not limit to monoamino group, diamino group, triamino group, and polyamino group, such as phenylaminomethyltriethoxysilane, phenylaminomethyltrimethoxysilane, or aminopropyltrimethoxysilane, their derivative compounds, or a combination thereof.

The organic resin may be a polyurethane based resin, such as polyurethane, 4'-diphenylmethane diisocyanate, or a combination thereof.

In an embodiment, the organic ligand is, for example, a chelating agent, wherein the coordinating atoms in the chelating agent are oxygen atom, nitrogen atom, sulfur atom, phosphorus atom, arsenic atom, etc. The organic ligand can effectively react with the functional groups at both ends of the coupling agent for forming bondings. The chelating agent is an organic chelating agent, a metal chelating agent, or a combination thereof. The chelating agent may be one or a mixture of ethylenediaminetetraacetic acid (EDTA), ethylenediamine, sodium potassium tartrate, etc.

In some embodiments, the composite formulated organic coating material includes an epoxy-based silane coupling agent (i.e., the base solution) and a chelating agent (i.e., the additive). The content of the epoxy-based silane coupling agent (i.e., the base solution) is about 0.05 to about 5 wt % of the composite formulated organic coating material, and the content of the chelating agent (i.e., the additive) is about 0.05 to about 10 wt % of the composite formulated organic coating material. The volume ratio of the epoxy-based silane coupling agent to the chelating agent is 1:100 to 100:1, such as 1:1 to 10:1, 1:1 to 6:1, 3:1 to 10:1, 3:1 to 6:1, or the like. In Table 1, (A) represents an epoxy-based silane coupling agent, as specifically shown in Formula 1; (B1) represents a chelating agent, which is specifically EDTA ($C_{10}H_{16}N_2O_8$ [Formula 2]). In Scheme 1, 5 ml of chemical of Formula 1 and 1.67 ml of the chelating agent of Formula 2 are mixed into a solution (A+B1), which is in a content of 1.33 wt % of the composite formulated organic coating material, to treat the copper layer; and the numbers of various sizes of silver wires (number of particles) on the copper layer are measured. Similarly, in Scheme 2, 5 ml of the chemical of Formula 1 and 1.67 ml of the chelating agent of Formula 2 are mixed into a solution (A+B1), which is in a content of 0.67 wt % of the composite formulated organic coating material. Similarly, in Scheme 3, 2.5 ml of the chemical of Formula 1 and 0.83 ml of the chelating agent of Formula 2 are mixed into a solution (A+B1), which is in a content of 0.33 wt % of the composite formulated organic coating material. Table 1 shows that the numbers of various sizes of silver wires (number of particles) on the copper layer all decrease, wherein, the number of large-size particles with a diameter more than 40 μm is reduced to less than 5, which indicates that the aggregation degree of silver wires has been reduced.

TABLE 1

| | A (ml) | B1 (ml) | 10 μm < size ≤ 20 μm | 20 μm < size ≤ 40 μm | size > 40 μm |
|---|---|---|---|---|---|
| Scheme 1 | 5 | 1.67 | 4 | 0 | 0 |
| Scheme 2 | 5 | 1.67 | 25 | 15 | 5 |
| Scheme 3 | 2.5 | 0.83 | 16 | 7 | 0 |
| w/o treatment | | | 33 | 8 | 10 |

[Formula 1]

In some embodiments, the content of the epoxy-based silane coupling agent (i.e., the base solution) is about 0.5 to about 2.5 wt % of the composite formulated organic coating material, and the content of the amine-based silane coupling agent (i.e., the additive) is about 2 to about 10 wt % of the composite formulated organic coating material. The ratio (volume ratio) of the epoxy-based silane coupling agent to the amine-based silane coupling agent is 1:100 to 100:1, such as 1:1 to 1:10, 1:1 to 1:6, 1:4 to 1:10, 1:4 to 1:6 or the like. In Table 2, (A) represents an epoxy-based silane coupling agent, as specifically shown in Formula 1; (B2) represents an amine-based silane coupling agent, which is specifically N-2-aminoethyl-3-aminepropyltrimethoxysilane ([Formula 3]). In Scheme 4, 2.5 ml of the chemical of Formula 1 and 10 ml of chemical of Formula 3 are mixed into a solution (A+B2), which is in a content of 5.0 wt % of the composite formulated organic coating material, to treat the copper layer; and the numbers of various sizes of silver wires (number of particles) on the copper layer are measured. Similarly, in Scheme 5, 1.3 ml of the chemical of Formula 1 and 5.2 ml of the chemical of Formula 3 are mixed into a solution (A+B2), which is in a content of 1.3 wt % of the composite formulated organic coating material. Similarly, in Scheme 6, 2 ml of the chemical of Formula 1 and 8 ml of the chemical of Formula 3 are mixed into a solution (A+B2), which is in a content of 1.0 wt % of the composite formulated organic coating material. Similarly, in Scheme 7, 0.5 ml of the chemical of Formula 1 and 2 ml of the chemical of Formula 3 are mixed into a solution (A+B2), which is in a content of 0.5 wt % of the composite formulated organic coating material. Table 2 shows that the numbers of various sizes of silver wires (number of particles) on the copper layer all decrease, particularly, the reduced number of large-size particles indicates that the aggregation degree of silver wires has been reduced.

TABLE 2

| | A (ml) | B2 (ml) | 10 μm < size ≤ 20 μm | 20 μm < size ≤ 40 μm | size > 40 μm |
|---|---|---|---|---|---|
| Scheme 4 | 2.5 | 10 | 6 | 4 | 3 |
| Scheme 5 | 1.3 | 5.2 | 8 | 3 | 0 |
| Scheme 6 | 2 | 8 | 46 | 11 | 0 |
| Scheme 7 | 0.5 | 2 | 8 | 2 | 0 |
| w/o treatment | | | 33 | 8 | 10 |

In some embodiments, the epoxy-based silane coupling agent (i.e., the base solution) and the polyurethane based resin (i.e., the additive) are mixed at a ratio of 1:1 to 100:1, such as 1:1 to 10:1, 10:1 to 100:1, 5:1 to 10:1 or the like. In Table 3, (A) represents an epoxy-based silane coupling agent, as specifically shown in Formula 1; (B3) represents an polyurethane based resin, which is specifically polyurethane ([Formula 4]). In Scheme 8, 2.5 ml of the chemical of Formula 1 and 245 ml of the polyurethane based resin (Formula 4, with a volume percentage of 1%) are mixed into a solution (A+B3), which is in a content of 2.0 wt % of the composite formulated organic coating material, to treat the copper layer; and the numbers of various sizes of silver wires (number of particles) on the copper layer are measured. Similarly, in Scheme 9, 2.5 ml of the chemical of Formula 1 and 24.5 ml of the polyurethane based resin (Formula 4, with a volume percentage of 1%) are mixed into a solution (A+B3), which is in a content of 1.1 wt % of the composite formulated organic coating material. Similarly, in Scheme 10, 2.5 ml of the chemical of Formula 1 and 2.45 ml of the polyurethane based resin (Formula 4, with a volume percentage of 1%) are mixed into a solution (A+B3), which is in a content of 1.01 wt % of the composite formulated organic coating material. Table 3 shows that the numbers of various sizes of silver wires (number of particles) on the copper layer all decrease, particularly, the reduced number of large-size particles indicates that the aggregation degree of silver wires has been reduced.

In some embodiments, a combination of two or more additives can be mixed with the base solution. For example, a combination of two additives, that is, the polyurethane based resin and the amine-based silane coupling agent, and the polyurethane based resin (i.e., the base solution) are mixed at a certain ratio. For example, the base solution and the combination of additives are mixed at a ratio (volume ratio) of 1:1 to 1:100, such as 1:1 to 1:10, 1:1 to 1:5, 1:1 to 1:4 or the like. In the combination of additives of this embodiment, the epoxy-based silane coupling agent and the polyurethane based resin are mixed at a ratio of 1:1 to 1:10, such as 1:1 to 1:15, 1:1 to 1:2, or the like. In Table 3, (A) represents an epoxy-silane coupling agent, as specifically shown in Formula 1; (B4) represents the combination of an amine-based silane coupling agent ([Formula 3]) and a polyurethane based resin ([Formula 4]). In Scheme 11, 1 ml of the chemical of Formula 1, 4 ml of the chemical of Formula 3 and 90 ml of the polyurethane based resin (Formula 4, with a volume percentage of 1%) are mixed into a solution (A+B4), which is in a content of 0.5 wt % of the composite formulated organic coating material, to treat the copper layer; and the numbers of various sizes of silver wires (number of particles) on the copper layer are measured. Similarly, in Scheme 12, 1 ml of the chemical of Formula 1, 4 ml of the chemical of Formula 3 and 9.8 ml of the polyurethane based resin (Formula 4, with a volume percentage of 1%) are mixed into a solution (A+B4), which is in a content of 0.5 wt % of the composite formulated organic coating material. Table 4 shows that the numbers of various sizes of silver wires (number of particles) on the copper layer all decrease, particularly, the reduced number of large-size particles indicates that the aggregation degree of silver wires has been reduced.

TABLE 3

| | A (ml) | B3 (ml) | 10 μm < size ≤ 20 μm | 20 μm < size ≤ 40 μm | size > 40 μm |
|---|---|---|---|---|---|
| Scheme 8 | 2.5 | 245 | 72 | 5 | 1 |
| Scheme 9 | 2.5 | 24.5 | 46 | 11 | 2 |
| Scheme 10 | 2.5 | 2.45 | 40 | 23 | 3 |
| w/o treatment | | | 33 | 8 | 10 |

TABLE 4

| | A (ml) | B4 | 10 μm < size ≤ 20 μm | 20 μm < size ≤ 40 μm | size > 40 μm |
|---|---|---|---|---|---|
| Scheme 11 | 1 | Formula 3 + Formula 4 | 28 | 10 | 4 |
| Scheme 12 | 1 | Formula 3 + Formula 4 | 8 | 4 | 0 |
| w/o treatment | | | 30 | 8 | 10 |

The "metal nanowires" used herein is a collective term, which refers to a collection of metal wires including a plurality of element metals, metal alloys, or metal compounds (including metal oxides), and the number of metal nanowires included therein does not affect the scope protected by the present disclosure. In addition, at least one size of the cross-section (i.e., the diameter of the cross-section) of a single metal nanowire is less than about 500 nm, preferably less than about 100 nm, and more preferably less than about 50 nm. The metal nanostructure called "wire" in the present disclosure mainly has a high aspect ratio, for example, between about 10 and 100,000. More specifically, the aspect ratio (length:diameter of cross section) of the metal nanowire can be greater than about 10, preferably greater than about 50, and more preferably greater than about 100. The metal nanowire can be any metal, including (but not limited to) silver, gold, copper, nickel, and gold-plated silver. If other terms, such as silk, fiber, tube, etc., also have the size and the high aspect ratio mentioned above, they are also within the scope protected by the present disclosure. In some embodiments, the silver nanowire layer 608 is prepared by coating a coating composition including silver nanostructures. In order to form the coating composition, the silver nanowires are generally dispersed to form a silver nanowire ink/dispersion for facilitating the coating process. It should be understood that any suitable liquid that forms stable silver nanowire dispersion can be used as described herein. Preferably, the silver nanowires are dispersed in water, alcohol, ketone, ether, hydrocarbon, or aromatic solvents (benzene, toluene, xylene, etc.). More preferably, the liquid has volatility and a boiling point not greater than 200° C., not greater than 150° C., or not greater than 100° C. After the curing/drying step, the substances such as solvent in the slurry are volatilized, while the metal nanowires are distributed on the surface of the substrate in a random manner, and the metal nanowires can contact with each other to provide a continuous current path, thereby forming a conductive network.

In addition, a film layer may be coated, such that the film layer forms a composite structure with the metal nanowires, and the composite structure has certain specific chemical, mechanical, and optical properties, such as an adhesion between the metal nanowires and the substrate, or a better physical mechanical strength. Therefore, the film layer can be called matrix. On the other hand, under the condition that some specific polymers are used to produce the film layer such that the metal nanowires have an additional surface protection against scratches and abrasion, the film layer can be called a hard coat or an overcoat. For example, polyacrylate, epoxy resin, polyurethane, polysilane, polysiloxane, poly(silicone-acrylate), etc. allow the metal nanowires to have a higher surface strength, thereby improving the scratch resistance. Furthermore, the film layer can be added with ultraviolet (UV) stabilizers, so as to improve the UV resistance of the metal nanowires. However, those mentioned above are only for illustrating the possibility of other additional functions/names of the film layer and are not intended to limit the present disclosure.

In the embodiments of the present disclosure, the above-mentioned stacked structure can be further subject to a patterning process, including steps such as pattern exposure, development, and etching, so as to form the copper layer 604, the silver nanowire layer 608, or both of them into a circuit pattern. The nanowire-distribution-promotion layer 606 can be etched in the step of etching the copper layer 604 or etching the silver nanowire layer 608. Alternatively, the copper layer 604, the silver nanowire layer 608, and the nanowire-distribution-promotion layer 606 can be etched in a same etching step.

It can be seen that in the stacked structure of the copper layer and the silver nanowire layer, the nanowire-distribution-promotion layer can provide a significant uniform distribution effect, such that the silver nanowire can be uniformly distributed on the copper layer without aggregation.

The embodiments of the present disclosure can solve the peeling problem of the contact structure, such that the electronic device including this contact structure can be produced by the yellow-light process and has a high reliability. By adopting a production method of yellow-light process to manufacture an electronic device including conductive film layers, it is possible to provide a better time efficiency and reduce the production cost.

Although the content of the present disclosure has been disclosed above by means of embodiments, it is not intended to limit the present disclosure. Any one skilled in the art can make various changes and modifications without departing from the spirit and scope of the present disclosure. Therefore, the scope protected by the present disclosure shall defined by the appended claims.

What is claimed is:

1. A contact structure, comprising:
    a substrate;
    a copper layer disposed over the substrate;
    a nanowire-distribution-promotion layer disposed over the copper layer and comprising an organic material; and
    a silver nanowire layer disposed over the nanowire-distribution-promotion layer, wherein the silver nanowire layer comprises nanowires and a film layer to define a composite, and fewer than 5 nanowire-aggregation particles with a diameter of more than 40 μm are present at an interface of the copper layer and the silver nanowire layer.

2. The contact structure according to claim 1, wherein the nanowire-distribution-promotion layer is an organic layer formed by curing a composite formulated organic coating material, and the composite formulated organic coating material comprises 0.05 wt % to 2.5 wt % of a base solution, 1.5 wt % to 10 wt % of an additive, and 80 wt % to 99.8 wt % of a solvent.

3. The contact structure according to claim 2, wherein the base solution is a first coupling agent, the additive is a second coupling agent, a chelating agent, an organic resin, or a combination thereof, and the first coupling agent is different from the second coupling agent.

4. The contact structure according to claim 3, wherein the first coupling agent is an epoxy-based silane coupling agent, and the second coupling agent is an amine-based silane coupling agent.

5. The contact structure according to claim 3, wherein the base solution is an epoxy-based silane coupling agent, the additive is a chelating agent, and a volume ratio of the epoxy-based silane coupling agent to the chelating agent is 3:1.

6. The contact structure according to claim 3, wherein the base solution is an epoxy-based silane coupling agent, the additive is an amine-based silane coupling agent, and a volume ratio of the epoxy-based silane coupling agent to the amine-based silane coupling agent is 1:4.

7. The contact structure according to claim 1, wherein the nanowire-distribution-promotion layer has a thickness of about 50 nm to about 100 nm.

8. An electronic device, comprising the contact structure according to claim 1.

9. The electronic device according to claim 8, wherein the contact structure is located in a peripheral area of the electronic device.

10. An electronic device, comprising the contact structure according to claim 2.

11. The electronic device according to claim 10, wherein the contact structure is located in a peripheral area of the electronic device.

12. An electronic device, comprising the contact structure according to claim 3.

13. The electronic device according to claim 12, wherein the contact structure is located in a peripheral area of the electronic device.

14. An electronic device, comprising the contact structure according to claim 4.

15. The electronic device according to claim 14, wherein the contact structure is located in a peripheral area of the electronic device.

16. An electronic device, comprising the contact structure according to claim 5.

17. The electronic device according to claim 16, wherein the contact structure is located in a peripheral area of the electronic device.

18. An electronic device, comprising the contact structure according to claim 6.

19. The electronic device according to claim 18, wherein the contact structure is located in a peripheral area of the electronic device.

20. An electronic device, comprising the contact structure according to claim 7.

* * * * *